(12) United States Patent
Tobisawa et al.

(10) Patent No.: US 6,486,242 B1
(45) Date of Patent: Nov. 26, 2002

(54) FLAME-RETARDANT RESIN COMPOSITION AND PREPREG AND LAMINATE USING THE SAME

(75) Inventors: Akihiko Tobisawa, Fujieda (JP); Tomoyoshi Honjoya, Fujieda (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/550,014

(22) Filed: Apr. 14, 2000

(30) Foreign Application Priority Data

| Apr. 20, 1999 | (JP) | 11-112155 |
| Apr. 20, 1999 | (JP) | 11-112156 |
| Apr. 21, 1999 | (JP) | 11-113308 |
| Jun. 3, 1999 | (JP) | 11-156623 |
| Aug. 9, 1999 | (JP) | 11-225257 |

(51) Int. Cl.[7] .................................................. C08J 3/00
(52) U.S. Cl. .................... 524/117; 524/139; 523/451
(58) Field of Search ............................. 524/117, 139; 523/451

(56) References Cited

U.S. PATENT DOCUMENTS 5,994,429 A * 11/1999 Honda ................... 523/451
6,180,695 B1 * 1/2001 Ito et al. ................. 523/451

FOREIGN PATENT DOCUMENTS

| JP | 61157519 | * | 7/1986 |
| JP | 61166822 | * | 7/1986 |

OTHER PUBLICATIONS

Wang, C.S. Polymer, 1998. vol. 39 No. 23 pp. 5819–5826.*

* cited by examiner

Primary Examiner—Cephia D. Toomer
(74) Attorney, Agent, or Firm—Smith, Gambrell & Russell, LLP

(57) ABSTRACT

The present invention provides a flame-retardant resin composition having high flame retardancy without using any halogen compound and suited for printed circuit boards. Specifically, it provides a flame-retardant resin composition containing as its essential constituents:

(A) a novolak epoxy resin,
(B) a novolak resin, and
(C) a phosphorus compound reactable with said epoxy resin or novolak resin, and also provides prepregs and laminates or copper-clad laminates using this resin composition.

11 Claims, No Drawings

FLAME-RETARDANT RESIN COMPOSITION AND PREPREG AND LAMINATE USING THE SAME

FIELD OF THE INVENTION AND RELATED ART STATEMENT

The present invention relates to a resin composition having excellent flame retardancy without using any halogenous flame retarder, and prepregs and laminates using the resin composition.

Thermosetting resins, such as epoxy resins typically, are widely used for electric and electronic equipment parts because of their excellent properties, and in many cases such resins are provided with flame retardancy for securing safety against fire. Conventionally, halogen-containing compounds such as brominated epoxy resins have been generally used as flame-retardant resins. These halogen-containing compounds have a high degree of flame retardance, but aromatic bromine compounds not only release corrosive bromine and hydrogen bromide when pyrolized but also are liable to form highly toxic polybromodibenzofuran and polydibromobenzoxine when decomposed in the presence of oxygen. Further, superannuated waste material containing bromine is very difficult to dispose of. For these reasons, attention is now focused on phosphorus compounds for use as a flame retarder in place of the conventional bromine-containing compounds.

As mentioned above, flame retardation can be realized by use of phosphorus compounds. Their flame-retarding mechanism is as follows: decomposition and thermal condensation of a phosphorus compound generates polyphosphoric acid, and this polyphosphoric acid forms a coating film on the surface of an epoxy resin to produce heat-insulating effect and oxygen barrier effect, which serve for preventing combustion of the resin.

The phosphorus compounds, however, have disadvantages in that they are apt to absorb water, and that if they are added in large quantities in a thermosetting resin for providing the desired flame retarding effect, the innate properties of the resin would be greatly deteriorated.

OBJECT AND SUMMARY OF THE INVENTION

The present invention has been attained as a result of the studies pursued for solving the above problems, and it realizes the objective flame retardation without using any halogenous compound, by using a novolak epoxy resin and a novolak resin, both of which have high heat resistance, as an epoxy resin and a curing agent therefor, and further by incorporating therein a phosphorus compound. Because of use of a resin and a curing agent both having high heat resistance, the present invention can provide a resin composition having sufficient flame retardancy by addition of a small quantity of a phosphorus compound. The present invention is also designed to provide prepregs using the resin composition, and flame-retardant laminates made of the prepregs.

The present invention provides a flame-retardant resin composition comprising as essential constituents (A) a novolak epoxy resin, (B) a novolak resin and (C) a phosphorus compound reactable with said epoxy resin or novolak resin. The present invention also provides a prepreg comprising a fiber base impregnated with said flame-retardant resin composition, and further provides a flame-retardant laminate or copper-clad laminate produced by hot-pressing a sheet or a stack of two or more sheets of said prepreg.

DETAILED DESCRIPTION OF THE INVENTION

As mentioned above, use of a phosphorus compound can realize sufficient flame retardance without using a halogen compound. The phosphorus compound, however, has tendency to absorb moisture, so that use of the phosphorus compound in large quantities gives adverse effect to the innate properties such as moisture resistance of the cured product of a resin. But the novolak epoxy resin and the novolak resin used in the present invention have a high content of benzene rings and high heat resistance, so that their flame retardance is higher than that of other ordinary epoxy resins. It is therefore possible to obtain sufficient flame retardance even if the amount of the phosphorus compound blended is lessened as compared with the conventional formulations.

Thus, the flame-retardant resin composition according to the present invention is highlighted in that it can provide sufficient flame retardance without using any halogen compound, by using an epoxy resin and a curing agent therefor both having high heat resistance, and also using a phosphorus compound as a flame retarder.

The novolak epoxy resins usable as constituent (A) in the present invention include, for example, phenolic novolak epoxy resins, cresol novolak epoxy resins, bisphenol A novolak epoxy resins and the like, and are not limited thereto. Two or more types of these novolak epoxy resins may be used simultaneously. In view of heat resistance, it is preferable to use a phenolic novolak epoxy resin or a cresol novolak epoxy resin which has a higher content of benzene rings. The phenolic aralkyl epoxy resins represented by the following formula 1, the naphthalene aralkyl epoxy resins represented by the following formula 2 and the biphenyl-modified epoxy resins represented by the following formula 3 are also preferred as they can provide higher heat resistance and lower water absorption because of a high content of aromatic rings and a small proportion of polar groups:

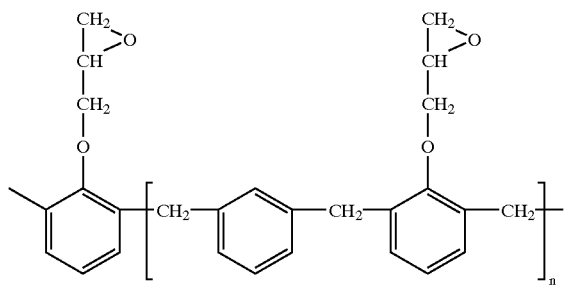

1 wherein n is a natural number,

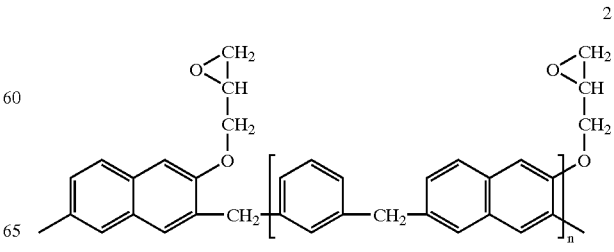

2 wherein n is a natural number,

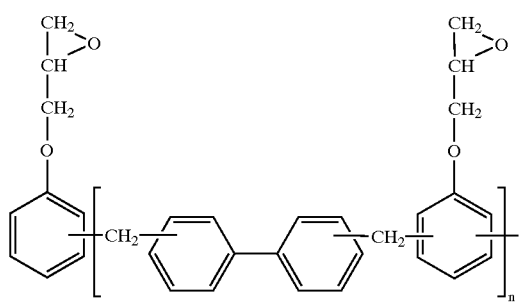

wherein n is a natural number.

It is advisable for the improvement of heat resistance and flame retardance to use a novolak epoxy resin as mentioned above in an amount of 50% by weight or more in the whole epoxy resin.

As the novolak resin (B), usually phenolic novolak resins or phenolic aralkyl resins are used in the present invention. Use of a triazine-modified novolak resin represented by the following formula 4 is preferred as flame retardance is improved by the triazine rings which constitute the nitrogenous moiety. Since an epoxy resin having high heat resistance is used for improving flame retardance, a nitrogen content of higher than 2.5% is unnecessary considering that a phosphorus compound is contained. A nitrogen content exceeding 4.0% is undesirable as it elevates hygroscopicity of the composition.

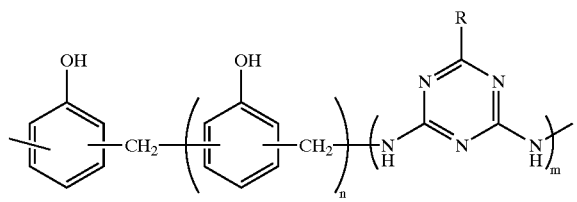

In the above formula, R is $NH_2$, alkyl group or phenyl group; and n and m are each a natural number.

The phenolic aralkyl resins represented by the following formula 5, the naphthalene aralkyl resins represented by the following formula 6, the biphenyl-modified novolak resins represented by the following formula 7 and the toluene-, xylene- or mesitylene-modified novolak resins represented by the following formula 8 are preferred as they are helpful for providing high heat resistance and low water absorption because of a high content of aromatic rings and a low proportion of polar groups:

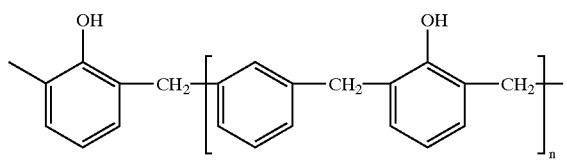

wherein n is a natural number,

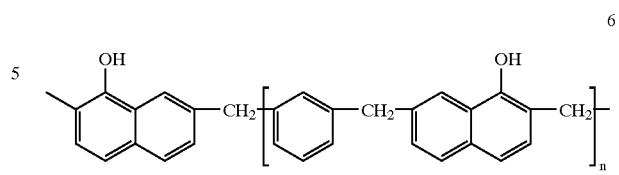

wherein n is a natural number,

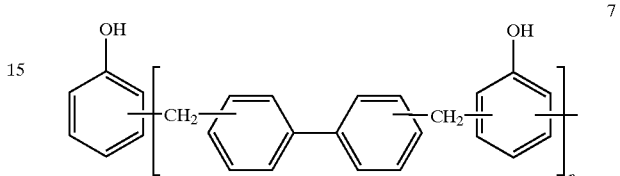

wherein n is a natural number,

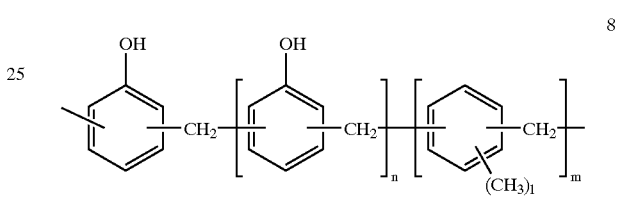

wherein m and n are each a natural number, and l is a number of 1, 2 or 3.

In the present invention, as the novolak resin (B), combined use of a triazine-modified novolak resin (a) of the formula 4 and at least one member (b) selected from the phenolic aralkyl resins of the formula 5, the naphthalene aralkyl resins of the formula 6, the biphenyl-modified novolak resins of the formula 7 and the toluene-, xylene- or mesitylene-modified novolak resins of the formula 8 is preferred as it gives high heat resistance and excellent flame retardance to the composition. The (a)/(b) ratio in this combination is preferably 60/40 to 20/80 in view of said properties.

The ratio of the novolak resin to the novolak epoxy resin in the composition is preferably 0.8 to 1.2 in terms of equivalent ratio (phenolic hydroxyl groups/epoxy groups). If this ratio is above or below the above-defined range, there remain the free epoxy groups or phenolic hydroxyl groups to adversely affect heat resistance and/or water absorption properties of the composition.

Use of a bisphenol S compound represented by the following formula 9 with a novolak resin is also preferable as it provides a quick-curing composition:

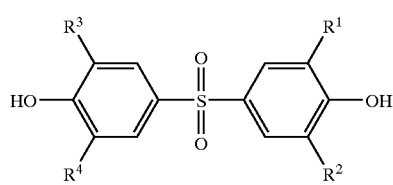

wherein $R^1$, $R^2$, $R^3$ and $R^4$ are each hydrogen, alkyl group or aryl group.

In this case, the amount of the novolak resin blended is lessened by a portion equivalent to the amount of the phenolic hydroxyl groups of the bisphenol S compound. The amount of the bisphenol S compound blended is preferably 5 to 20 parts by weight per 100 parts by weight of the novolak resin (B). Use of the bisphenol S compound in excess of 20 parts by weight is undesirable as it increases the tendency of the composition to absorb moisture.

A phosphorus compound (C) reactable with the epoxy resin or the novolak resin used in the present invention is blended as a flame retarder. It is preferably a halogen-free compound for the purport of the present invention. Blending of such a phosphorus compound improves heat and water resistance, chemical resistance and dimensional stability of the composition as this compound can be incorporated in the resin skeleton. A non-reactable phosphorus compound such as triphenyl phosphate or cresyl diphenyl phosphate may be used when necessary for providing the required properties of the composition. Since flame retardance is improved by use of an epoxy resin and a novolak resin each having high heat resistance, it is sufficient to provide a phosphorus content of 3.0% in the resin composition by blending of a phosphorus compound. If the phosphorus content is less than 0.5%, the desired flame retardance may not be obtained, so that the preferred range of phosphorus content is from 0.5 to 3.0%. When the phosphorus content exceeds 3.0%, the composition becomes too hygroscopic.

The phosphorus compound (C) reactable with the epoxy resin or the novolak resin used in this invention includes 9,10-dihydro-9-oxa-10-phosphaphenanthrene-10-oxide, tris-(4-aminophenyl)phosphine oxide, and the like. Among them, 9,10-dihydro-9-oxa-10-phosphaphenanthrene-10-oxide is preferable, as this compound is high in phosphorus content, has good reactability with the epoxy resins and is also inexpensive.

The flame-retardant resin composition of the present invention contains as its essential constituents a novolak epoxy resin, a novolak resin and, as a flame retarder, a phosphorus compound reactable with said epoxy resin or novolak resin, the preferred examples of these constituents being as mentioned above, but it is also possible to contain other types of epoxy resin and curing agent, or other types of resin, curing agent, curing accelerator, coupling agent and other necessary additives within the range satisfying the purpose of the present invention.

The flame-retardant resin composition according to the present invention can be put into use in various forms. In case it is impregnated in a fiber base, it is usually used in the form of a varnish prepared by dissolving the composition in a solvent. The solvent used therefor is preferably the one showing good solubility for the composition, but it is possible to use a poor solvent within the range not causing adverse effect.

The varnish obtained by dissolving the resin composition of this invention in a solvent is coated on or impregnated in a base material such as glass woven fabric, glass nonwoven fabric, or woven or nonwoven fabric made of materials other than glass fiber, and dried at 80 to 200° C. to obtain a prepreg. The prepreg is hot-pressed to produce a laminate or a copper-clad laminate. The flame-retardant resin composition of the present invention is a thermosetting resin composition having a high degree of flame retardance without containing any halogen compound, and it finds particularly useful application to the production of prepregs or laminates for printed circuit boards.

DESCRIPTION OF PREFERRED EMBODIMENTS

The present invention will be described in further detail with reference to the examples thereof.

EXAMPLE 1

To a mixture of 100 parts by weight of a phenolic novolak epoxy resin (Epiclon N-770 produced by Dai-Nippon Ink and Chemicals, Ltd.), 32 parts by weight of a phenolic aralkyl resin (Milex XLC-LL produced by Mitsui Chemical Co., Ltd.), 31 parts by weight of a triazine-modified phenolic novolak resin (LA-7054 produced by Dai-Nippon Ink and Chemicals, Ltd.) and 21 parts by weight of 9,10-dihydro-9-oxa-10-phosphaphenanthrene-10-oxide (HCA), methl cellosolve was added to prepare a varnish having a nonvolatile concentration of 60% by weight. The varnish had a phosphorus content of 1.7% by weight and a nitrogen content of 2.0% by weight based on the total amount (100% by weight) of the epoxy resin, curing agent and phosphorus compound. This varnish was impregnated in a glass woven fabric (0.18 mm thick, mfd. by Nitto Boseki K K) at a ratio of 80 parts by weight (solid content) to 100 parts by weight of the glass woven fabric, and dried in a 150° C. drying oven for 5 minutes to make a prepreg having a resin content of 44.4% by weight.

Six sheets of this prepreg were placed one over another, with a 35 μm thick electrolytic copper foil being attached on the top and bottom sides of the pile, and subjected to hot pressing molding under the conditions of 40 kgf/cm$^2$ and 190° C. for 120 minutes to obtain a 1.2 mm thick double-side copper-clad laminate.

EXAMPLES 2–7 AND COMPARATIVE EXAMPLES 1–6

Varnishes having a nonvolatile concentration of 60% by weight were prepared using the formulations of the resin compositions shown in Table 1 (Examples) and Table 2 (Comparative Examples) and methyl cellosolve. After that, the same procedure as in Example 1 was followed to make the double-side copper-clad laminates.

Flame retardance, soldering heat resistance and peel strength of the resultant copper-clad laminates were determined. The results are shown in Tables 1 and 2. Any of the copper-clad laminates according to the Examples of the present invention is excellent in all of flame retardancy, soldering heat resistance and peel strength.

TABLE 1

|  |  | Example 1 | Example 2 | Example 3 | Example 4 | Example 5 | Example 6 | Example 7 |
|---|---|---|---|---|---|---|---|---|
| Formulation (parts by weight) | Phenolic novolak epoxy resin[1] | 100 |  |  |  |  |  | 100 |
|  | Cresol novolak epoxy resin[2] |  |  | 100 |  |  | 100 |  |
|  | Naphthalene aralkyl epoxy |  | 100 |  |  |  |  |  |

TABLE 1-continued

|  |  | Example 1 | Example 2 | Example 3 | Example 4 | Example 5 | Example 6 | Example 7 |
|---|---|---|---|---|---|---|---|---|
|  | resin[3)] |  |  |  |  |  |  |  |
|  | Biphenyl-modified epoxy resin[4)] |  |  |  | 100 | 100 |  |  |
|  | Phenolic aralkyl resin[5)] | 32 | 23 | 26 |  |  | 34 | 33 |
|  | Triazine-modified phenolic novolak resin[6)] | 31 | 23 | 26 |  |  | 26 |  |
|  | Phenolic novolak resin[7)] |  |  |  | 30 |  |  |  |
|  | Xylene-modified novolak resin[8)] |  |  |  |  | 71 |  |  |
|  | Bisphenol S[9)] |  |  | 6 |  |  |  |  |
|  | HCA[10)] | 21 | 20 | 23 | 17 | 17 | 23 |  |
|  | Tris-(4-amino-phenyl)phosphine oxide |  |  |  |  |  |  | 28 |
|  | Phosphorus (wt %) | 1.7 | 1.8 | 1.9 | 1.7 | 1.3 | 1.8 | 1.7 |
|  | Nitrogen (wt %) | 2.0 | 1.7 | 1.7 | 0.0 | 0.0 | 1.7 | 2.3 |
| Properties | Flame retardancy test (UL94) | V-0 | V-0 | V-0 | V-0 | V-0 | V-0 | V-0 |
|  | Soldering heat resistance | No abnormality | No abnormality | No abnormality | No abnormality | No abnormality | No abnormality | No abnormality |
|  | Peel strength (kN/m) | 1.5 | 1.5 | 1.4 | 1.3 | 1.4 | 1.4 | 1.6 |

TABLE 2

|  |  | Comp. Example 1 | Comp. Example 2 | Comp. Example 3 | Comp. Example 4 | Comp. Example 5 | Comp. Example 6 |
|---|---|---|---|---|---|---|---|
| Formulation (parts by weight) | Phenolic novolak epoxy resin[1)] | 100 |  | 100 |  | 100 | 100 |
|  | Cresol novolak epoxy resin[2)] |  | 100 |  | 100 |  |  |
|  | Phenolic aralkyl resin[5)] | 32 | 32 | 32 | 32 |  |  |
|  | Triazine-modified phenolic novolak resin[6)] | 35 | 37 | 35 | 37 |  |  |
|  | Dicyandiamide |  |  |  |  | 5 | 6 |
|  | HCA[10)] |  |  |  |  | 25 | 13 |
|  | Triphenyl phosphate |  |  | 30 | 30 |  |  |
|  | Phosphorus (wt %) | 0.0 | 0.0 | 1.4 | 1.4 | 2.7 | 1.6 |
|  | Nitrogen (wt %) | 2.5 | 2.6 | 2.1 | 2.2 | 2.6 | 3.4 |
| Properties | Flame retardancy test (UL94) | HB | HB | V-0 | V-0 | V-0 | V-1 |
|  | Soldering heat resistance | No abnormality | No abnormality | Blistered | Blistered | Blistered | No abnormality |
|  | Peel strength (kN/m) | 1.5 | 1.5 | 1.5 | 1.5 | 1.4 | 1.4 |

Method of Measurement

1. Flame Retardance

Evaluated by the vertical method according to the UL-94 standards.

2. Soldering Heat Resistance

Measured according to JIS C-6481. The test piece was subjected to a 2-hour water-absorbing treatment in boiling water and then immersed in a 260° C. solder bath for 120 seconds, after which the appearance of the test piece was checked for any abnormality.

3. Peel Strength

Measured according to JIS C-6481.

Notes in the Tables

1) Epiclon N-770 produced by Dai-Nippon Ink and Chemicals, Ltd., epoxy equivalent: 190
2) Epiclon N-690 produced by Dai-Nippon Ink and Chemicals, Ltd., epoxy equivalent: 210
3) ESN-155 produced by Shin-Nittetsu Chemical Co., Ltd., epoxy equivalent: 275
4) NC-3000P produced by Nippon Kayaku K K, epoxy equivalent: 275
5) Milex XLC-LL produced by Mitsui Chemical Co., Ltd., hydroxy equivalent: 175
6) LA-7054 produced by Dai-Nippon Ink and Chemicals, Ltd., hydroxy equivalent: 125; nitrogen content: 12 wt %
7) PR-51470 produced by Sumitomo Durez Co., Ltd., hydroxy equivalent: 105
8) R-54537 produced by Sumitomo Durez Co., Ltd., hydroxy equivalent: 190
9) BPS-N produced by Nikka Chemical Co., Ltd., hydroxy equivalent: 125
10) 9,10-dihydro-9-oxa-10-phosphaphenanthrene-10-oxide As seen from Table 1, the flame-retardant resin composition according to the present invention possesses high flame retardancy without addition of any halogen compound and also has other excellent properties such as high heat resistance. Thus, it provides a novel thermosetting resin composition useful as a non-halogenous material which is expected to be demanded in the future. The prepregs and laminates made by using this resin composition are excellent not only in flame retardancy but also in other properties such as soldering heat resistance in use for a printed circuit board.

What is claimed is:

1. A flame-retardant resin composition containing as its essential constituents:

(A) a novolak epoxy resin, (B) a triazine-modified novolak resin represented by the formula 4:

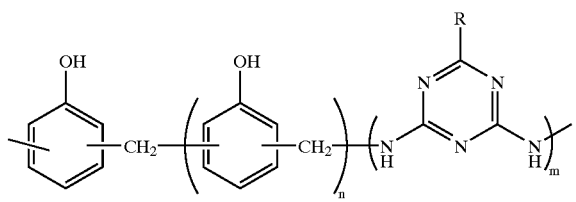

wherein R is NH$_2$, alkyl group or phenyl group; and m and n are each a natural number, and (C) a 9, 10-dihydro-9-oxa-10-phosphaphenanthrene-10-oxide.

2. A flame-retardant resin composition according to claim 1, wherein a part or the whole of the novolak epoxy resin (A) is a phenolic novolak epoxy resin.

3. A flame-retardant resin composition according to claim 1, wherein a part or the whole of the novolak epoxy resin (A) is a cresol novolak epoxy resin.

4. A flame-retardant resin composition according to claim 1, wherein a part or the whole of the novolak epoxy resin (A) is at least one member selected from a phenolic aralkyl epoxy resin represented by the formula 1, a naphthalene aralkyl epoxy resin represented by the formula 2 and a biphenyl-modified epoxy resin represented by the formula 3:

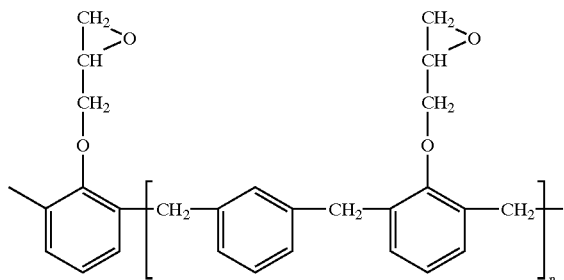

wherein n is a natural number,

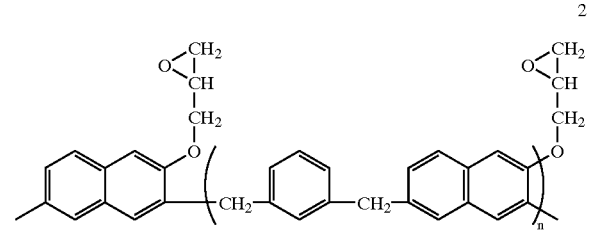

wherein n is a natural number,

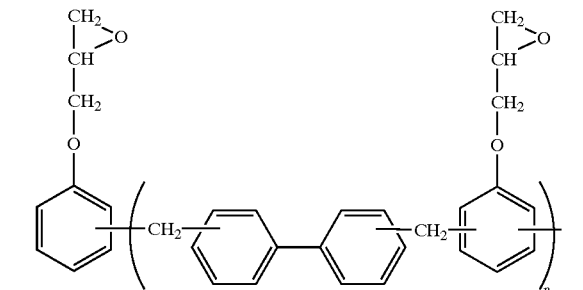

wherein n is a natural number.

5. A flame-retardant resin composition containing as its essential constituents:

(A) a novolak epoxy resin, (B) at least one member selected from the group consisting of a phenolic aralkyl resin represented by the formula 5, a naphthalene aralkyl resin represented by the formula 6, a biphenyl-modified novolak resin represented by the formula 7 and a toluene-, xylene- or mesitylene-modified novolak resin represented by the formula 8:

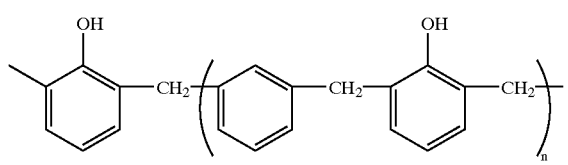

wherein n is a natural number,

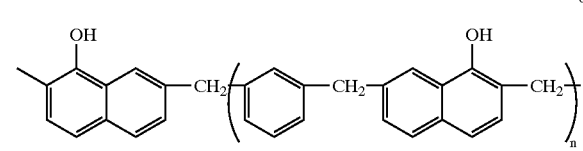

wherein n is a natural number,

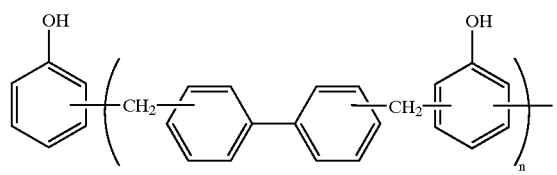

wherein n is a natural number,

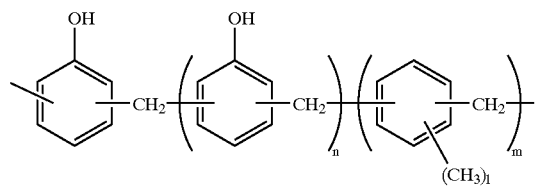

wherein m and n are each a natural number, and l is a number of 1, 2 or 3, and (C) a 9, 10-dihydro-9-oxa-10phosphaphenanthrene-10-oxide.

6. A flame-retardant resin composition containing as its essential constituents:
(A) a novolak epoxy resin,
(B) a novolak resin and a bisphenol S compound represented by the formula 9:

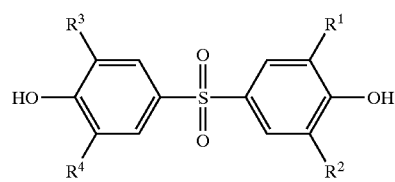

wherein $R^1$, $R^2$, $R^3$ and $R^4$ are each a hydrogen, an alkyl group or an aryl group, and (C) a 9, 10-dihydro-9-oxa-10-phosphaphenanthrene-10-oxide.

7. A flame-retardant resin composition according to claim 1, wherein the composition additionally comprises at least one member selected from the group consisting of a phenolic aralykl resin represented by the formula 5, a napthalene aralkyl resin represented by the formula 6, a biphenyl-modified novolak resin represented by the formula 7 and a toluene-, xylene- or mesitylene-modified novolak resin represented by the formula 8:

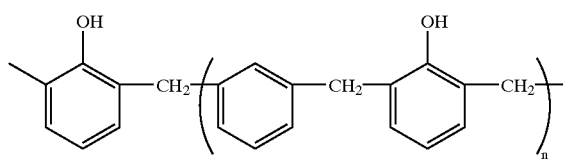

wherein n is a natural number,

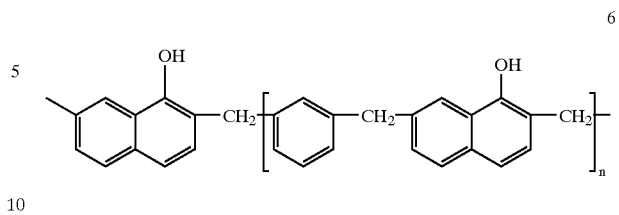

wherein n is a natural number,

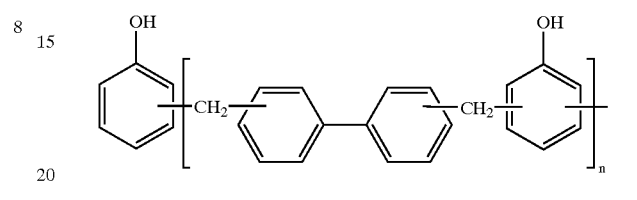

wherein n is a natural number,

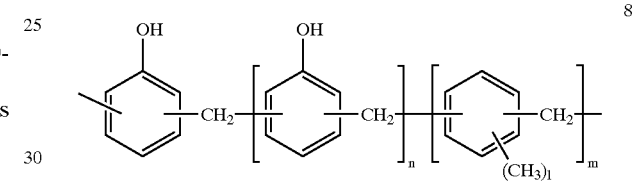

wherein m and n are each a natural number, and l is a number of 1, 2 or 3.

8. A flame-retardant resin composition according to claim 7, wherein the composition additionally comprises a bisphenol S compound represented by the formula 9:

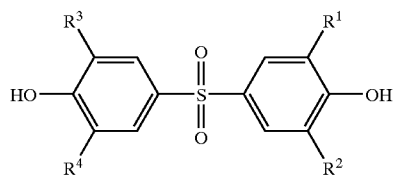

wherein $R^1$, $R^2$, $R^3$ and $R^4$ are each a hydrogen, an alkyl group or an aryl group.

9. A prepreg obtained by dissolving a flame-retardant resin composition set forth in claim 1 in a solvent to prepare a varnish and impregnating the varnish in a fibrous base sheet.

10. A laminate produced by placing two or more sheets of the prepreg of claim 9 one over another and hot-pressing them.

11. A copper-clad laminate produced by placing one or more sheets of prepreg of claim 9 one over another with a copper foil being attached on the top and bottom sides of the pile and hot-pressing them.

* * * * *